US006190830B1

(12) United States Patent
Leon et al.

(10) Patent No.: US 6,190,830 B1
(45) **Date of Patent: *Feb. 20, 2001**

(54) PROCESSLESS DIRECT WRITE PRINTING PLATE HAVING HEAT SENSITIVE CROSSLINKED VINYL POLYMER WITH ORGANOONIUM GROUP AND METHODS OF IMAGING AND PRINTING

(75) Inventors: Jeffrey W. Leon, Rochester; Gary M. Underwood, North Jupiter; James C. Fleming, Webster, all of NY (US)

(73) Assignee: Kodak Polychrome Graphics LLC, Norwalk, CT (US)

(*) Notice: Under 35 U.S.C. 154(b), the term of this patent shall be extended for 0 days.

This patent is subject to a terminal disclaimer.

(21) Appl. No.: 09/309,999

(22) Filed: May 11, 1999

Related U.S. Application Data

(63) Continuation-in-part of application No. 09/162,905, filed on Sep. 29, 1998, now abandoned.

(51) Int. Cl.[7] .......... G03F 7/004

(52) U.S. Cl. .......... 430/270.1; 430/302; 101/467

(58) Field of Search .......... 430/270.1, 286.1, 430/278.1, 302, 926

(56) References Cited

U.S. PATENT DOCUMENTS

| | | | |
|---|---|---|---|
| 3,964,389 | 6/1976 | Peterson | 101/467 |
| 4,034,183 | 7/1977 | Uhlig | 219/122 |
| 4,081,572 | 3/1978 | Pacansky | 427/53 |
| 4,405,705 | 9/1983 | Etoh et al. | 430/270 |
| 4,548,893 | 10/1985 | Lee et al. | 430/296 |
| 4,634,659 | 1/1987 | Esumi et al. | 430/302 |
| 4,693,958 | 9/1987 | Schwartz et al. | 430/302 |
| 4,920,036 * | 4/1990 | Totsuka et al. | 430/270 |
| 5,460,918 | 10/1995 | Ali et al. | 430/200 |
| 5,512,418 | 4/1996 | Ma | 430/271.1 |
| 5,569,573 | 10/1996 | Takahashi et al. | 430/138 |

FOREIGN PATENT DOCUMENTS

| | | |
|---|---|---|
| 200488 | 12/1986 | (EP) . |
| 0 652 483 A1 | 11/1993 | (EP) . |
| 609 930 * | 8/1994 | (EP) . |
| 615162 | 9/1994 | (EP) . |
| 646476 | 4/1995 | (EP) . |
| 92/09934 | 11/1990 | (WO) . |

OTHER PUBLICATIONS

Rosen, Stephen L. Fundamental Principles of Polymeric Materials, Second Edition. New York: John Wiley & Sons, Inc., (1993), pp. 15–18.*

* cited by examiner

*Primary Examiner*—Janet Baxter
*Assistant Examiner*—Barbara Gilmore
(74) *Attorney, Agent, or Firm*—Baker Botts L.L.P.

(57) ABSTRACT

An imaging member, such as a negative-working printing plate, can be prepared using a hydrophilic heat-sensitive imaging layer comprised of a hydrophilic heat-sensitive, crosslinked vinyl polymer containing recurring organoonium groups. The imaging member can also include a photothermal conversion material such as carbon black or an infrared radiation absorbing dye. The heat-sensitive polymer has recurring units containing an organoammonium, organophosphonium or organosulfonium group that reacts to provide increased oleophilicity (ink receptivity) in response to heat. Heat is preferably generated by laser irradiation in the IR region of the electromagnetic spectrum. The heat-sensitive polymer is considered "switchable" in response to heat. The imaging member can be used in printing methods without the usual wet processing steps.

28 Claims, No Drawings

PROCESSLESS DIRECT WRITE PRINTING PLATE HAVING HEAT SENSITIVE CROSSLINKED VINYL POLYMER WITH ORGANOONIUM GROUP AND METHODS OF IMAGING AND PRINTING

CROSS-REFERENCE TO RELATED APPLICATION

This application is a Continuation-in-part application of commonly assigned U.S. Ser. No. 09/162,905 filed Sep. 29, 1998, by Leon, Underwood and Fleming now abandoned.

FIELD OF THE INVENTION

This invention relates in general to lithographic imaging members, and particularly to lithographic printing plates that require no wet processing after imaging. The invention also relates to a method of digitally imaging such imaging members, and to a method of printing using them.

BACKGROUND OF THE INVENTION

The art of lithographic printing is based upon the immiscibility of oil and water, wherein an oily material or ink is preferentially retained by an imaged area and the water or fountain solution is preferentially retained by the non-imaged areas. When a suitably prepared surface is moistened with water and an ink is then applied, the background or non-imaged areas retain the water and repel the ink while the imaged areas accept the ink and repel the water. The ink is then transferred to the surface of a suitable substrate, such as cloth, paper or metal, thereby reproducing the image.

Very common lithographic printing plates include a metal or polymer support having thereon an imaging layer sensitive to visible or UV light. Both positive- and negative-working printing plates can be prepared in this fashion. Upon exposure, and perhaps post-exposure heating, either imaged or non-imaged areas are removed using wet processing chemistries.

Thermally sensitive printing plates are less common. Examples of such plates are described in U.S. Pat. No. 5,372,915 (Haley et al). They include an imaging layer comprising a mixture of dissolvable polymers and an infrared radiation absorbing compound. While these plates can be imaged using lasers and digital information, they require wet processing using alkaline developer solutions.

It has been recognized that a lithographic printing plate could be created by ablating an IR absorbing layer. For example, Canadian 1,050,805 (Eames) discloses a dry planographic printing plate comprising an ink receptive substrate, an overlying silicone rubber layer, and an interposed layer comprised of laser energy absorbing particles (such as carbon particles) in a self-oxidizing binder (such as nitrocellulose). Such plates were exposed to focused near IR radiation with a $Nd^{++}YAG$ laser. The absorbing layer converted the infrared energy to heat thus partially loosening, vaporizing or ablating the absorber layer and the overlying silicone rubber. The plate was developed by applying naphtha solvent to remove debris from the exposed image areas. Similar plates are described in *Research Disclosure* 19201, 1980 as having vacuum-evaporated metal layers to absorb laser radiation in order to facilitate the removal of a silicone rubber overcoated layer. These plates were developed by wetting with hexane and rubbing. $CO_2$ lasers are described for ablation of silicone layers by Nechiporenko & Markova, PrePrint 15th International IARIGAI Conference, June, 1979, Lillehammer, Norway, Pira Abstract 02-79-02834. Typically, such printing plates require at least two layers on a support, one or more being formed of ablatable materials. Other publications describing ablatable printing plates include U.S. Pat. No. 5,385,092 (Lewis et al), U.S. Pat. No. 5,339,737 (Lewis et al), U.S. Pat. No. 5,353,705 (Lewis et al), U.S. Pat. No. Reissue 35,512 (Nowak et al) and U.S. Pat. No. 5,378,580 (Leenders).

While the noted printing plates used for digital, processless printing have a number of advantages over the more conventional photosensitive printing plates, there are a number of disadvantages with their use. The process of ablation creates debris and vaporized materials that must be collected. The laser power required for ablation can be considerably high, and the components of such printing plates may be expensive, difficult to coat, or unacceptable in resulting printing quality. Such plates generally require at least two coated layers on a support.

Thermally switchable polymers have been described for use as imaging materials in printing plates. By "switchable" is meant that the polymer is rendered from hydrophobic to relatively more hydrophilic or, conversely from hydrophilic to relatively more hydrophobic, upon exposure to heat.

U.S. Pat. No. 4,034,183 (Uhlig) describes the use of high powered lasers to convert hydrophilic surface layers to hydrophobic surfaces. A similar process is described for converting polyamic acids into polyimides in U.S. Pat. No. 4,081,572 (Pacansky). The use of high powered lasers is undesirable in the industry because of their power requirements and because of their need for cooling and frequent maintenance.

U.S. Pat. No. 4,634,659 (Esumi et al) describes imagewise irradiating hydrophobic polymer coatings to render exposed regions more hydrophilic in nature. While this concept was one of the early applications of converting surface characteristics in printing plates, it has the disadvantages of requiring long UV light exposure times (up to 60 minutes), and the plate's use is in a positive-working mode only.

U.S. Pat. No. 4,405,705 (Etoh et al) and U.S. Pat. No. 4,548,893 (Lee et al) describe amine-containing polymers for photosensitive materials used in non-thermal processes. The imaged materials also require wet processing after imaging.

Thermal processes using polyamic acids and vinyl polymers with pendant quaternary ammonium groups are described in U.S. Pat. No. 4,693,958 (Schwartz et al), but wet processing is required after imaging.

U.S. Pat. No. 5,512,418 (Ma) describes the use of polymers having cationic quaternary ammonium groups that are heat-sensitive. However, like most of the materials described in the art, wet processing is required after imaging.

WO 92/09934 (Vogel et al) describes photosensitive compositions containing a photoacid generator and a polymer with acid labile tetrahydropyranyl or activated ester groups. However, imaging of these compositions converts the imaged areas from hydrophobic to hydrophilic in nature.

In addition, EP-A 0 652 483 (Ellis et al) describes lithographic printing plates imageable using IR lasers, and which do not require wet processing. These plates comprise an imaging layer that becomes more hydrophilic upon imagewise exposure to heat. This coating contains a polymer having pendant groups (such as t-alkyl carboxylates) that are capable of reacting under heat or acid to form more polar, hydrophilic groups. Imaging such compositions converts the imaged areas from hydrophobic to relatively more hydrophilic in nature, and thus requires imaging the background of the plate, which is generally a larger area. This can be a problem when imaging to the edge of the printing plate is desired.

The graphic arts industry is seeking alternative means for providing a processless, direct-write lithographic printing plate that can be imaged without ablation and the accompanying problems noted above. It would also be desirable to use "switchable" polymers without the need for wet processing after imaging, to render an imaging surface more oleophilic in exposed areas.

SUMMARY OF THE INVENTION

The problems noted above are overcome with an imaging member comprising a support having thereon a hydrophilic imaging layer comprising a hydrophilic heat-sensitive crosslinked vinyl polymer comprising recurring units comprising organoonium groups.

This invention also includes a method of imaging comprising the steps of:

A) providing the imaging member described above, and

B) imagewise exposing the imaging member to provide exposed and unexposed areas in the imaging layer of the imaging member, whereby the exposed areas are rendered more oleophilic than the unexposed areas by heat provided by the imagewise exposing.

Still further, a method of printing comprises the steps of carrying out steps A and B noted above, and additionally:

C) contacting the imaging member with a fountain solution and a lithographic printing ink, and imagewise transferring that printing ink from the imaging member to a receiving material.

The negative-working imaging members of this invention have a number of advantages, and avoid the problems of previous printing plates. Specifically, the problems and concerns associated with ablation imaging (that is, imagewise removal of a surface layer) are avoided because the hydrophilicity of the imaging layer is changed imagewise by "switching" (preferably irreversibly) exposed areas of its printing surface. A generally hydrophilic, heat-sensitive, crosslinked imaging polymer is rendered more oleophilic upon exposure to heat (such as generated or provided by IR laser irradiation or another energy source). Thus, the imaging layer stays intact during and after imaging (that is, no ablation is required). These advantages are achieved by using a hydrophilic heat-sensitive vinyl polymer having recurring organoonium groups (such as organoammonium, organophosphonium or organosulfonium groups). Such polymers and groups are described in more detail below. The polymers used in the imaging layer are generally inexpensive or readily prepared using procedures described herein, and the imaging members are simple to make and use without the need for post-imaging wet processing. The polymeric materials provide desired image discrimination, raw stock keeping and structural stability. The resulting printing members obtained from the imaging members are negative-working.

Highly ionic polymers in imaging members tend to be more water-soluble, and may wash off the imaging member when exposed to a fountain solution during printing. While imaging of such polymers can render them more oleophilic, not all of the charged groups "switch" to an uncharged state. Thus, even the exposed areas of the printing surface may have too many hydrophilic groups remaining. This small proportion of water-soluble groups can induce water solubility and result in adhesion or cohesion failure after imaging. The present invention provides preferred embodiments with the use of crosslinked vinyl polymers having cationic nitrogen, phosphorus or sulfur groups. This provides improved structural stability of the imaging layer during printing operations.

DETAILED DESCRIPTION OF THE INVENTION

The imaging members of this invention comprise a support and one or more layers thereon that are heat-sensitive. The support can be any self-supporting material including polymeric films, glass, ceramics, metals or stiff papers, or a lamination of any of these materials. The thickness of the support can be varied. In most applications, the thickness should be sufficient to sustain the wear from printing and thin enough to wrap around a printing form. A preferred embodiment uses a polyester support prepared from, for example, polyethylene terephthalate or polyethylene naphthalate, and having a thickness of from about 100 to about 310 μm. Another preferred embodiment uses aluminum foil having a thickness of from about 100 to about 600 μm. The support should resist dimensional change under conditions of use.

The support can also be a cylindrical surface having the heat-sensitive polymer composition thereon, and thus being an integral part of the printing press. The use of such imaged cylinders is described for example in U.S. Pat. No. 5,713,287 (Gelbart).

The support may be coated with one or more "subbing" layers to improve adhesion of the final assemblage. Examples of subbing layer materials include, but are not limited to, gelatin and other naturally occurring and synthetic hydrophilic colloids and vinyl polymers (such as vinylidene chloride copolymers) known for such purposes in the photographic industry, vinylphosphonic acid polymers, alkoxysilanes (such as aminopropyltriethoxysilane and glycidoxypropyltriethoxysilane), titanium sol gel materials, epoxy functional polymers, and ceramics.

The back side of the support may be coated with antistatic agents and/or slipping layers or matte layers to improve handling and "feel" of the imaging member.

The imaging members, however, have preferably only one heat-sensitive layer that is required for imaging. This hydrophilic layer includes one or more heat-sensitive polymers, and optionally but preferably a photothermal conversion material (described below), and preferably provides the outer printing surface of the imaging member. Because of the particular polymer(s) used in the imaging layer, the exposed (imaged) areas of the layer are rendered more oleophilic in nature.

The heat-sensitive polymers useful in this invention generally can be any of a wide variety of crosslinked vinyl homopolymers and copolymers having the requisite organoonium groups. They are prepared from ethylenically unsaturated polymerizable monomers using any conventional polymerization techniques. Procedures and reactants needed to prepare all of these types of polymers are well known. With the additional teaching provided herein, the known polymer reactants and conditions can be modified by a skilled artisan to incorporate or attach a suitable pendant cationic group.

Preferably, the polymers are copolymers prepared from two or more ethylenically unsaturated polymerizable monomers, at least one of which contains the desired organoonium group, and one or more other monomers that are capable of providing crosslinking in the polymer and possibly adhesion to the support.

The heat-sensitive polymers useful in this invention can be composed of recurring units having more than one type of organoonium group. For example, such a polymer can have recurring units with both organoammonium groups and organosulfonium groups. It is also not necessary that all of the organoonium groups have the same alkyl substituents. For example, a polymer can have recurring units having more than one type of organoammonium group.

The presence of an organoonium group (such as an organoammonium or quaternary ammonium group, organophosphonium or organosulfonium group) apparently provides or facilitates the "switching" of the imaging layer from hydrophilic to oleophilic in the exposed areas upon exposure to energy that provides or generates heat, when the cationic moiety reacts with its counterion. The net result is the loss of charge. Such reactions are more easily accomplished when the anion of the organoonium group is more nucleophilic and/or more basic. For example, an acetate anion is typically more reactive than a chloride anion. By varying the chemical nature of the anion, the reactivity of the heat-sensitive polymer can be modified to provide optimal image resolution for a given set of conditions (for example, laser hardware and power, and printing press needs) balanced with sufficient ambient shelf life. Useful anions include the halides, carboxylates, sulfates, borates and sulfonates. Representative anions include, but are not limited to, chloride, bromide, fluoride, acetate, tetrafluoroborate, formate, sulfate, p-toluenesulfonate and others readily apparent to one skilled in the art. The halides and carboxylates are preferred.

The organoonium group is present in sufficient recurring units of the polymer so that the heat-activated reaction described above can occur to provide desired oleophilicity of the imaged surface printing layer. The group can be attached along a principal backbone of the polymer, or to one or more branches of a polymeric network, or both. Pendant groups can be chemically attached to the polymer backbone after polymer formation using known chemistry. For example, pendant organoammonium, organophosphonium or organosulfonium groups can be provided on a polymeric backbone by the nucleophilic displacement of a pendant leaving group (such as a halide or sulfonate ester) on the polymeric chain by a trivalent amine, divalent sulfur or trivalent phosphorous nucleophile. Pendant onium groups can also be provided by alkylation of corresponding pendant neutral heteroatom groups (nitrogen, sulfur or phosphorous) using any commonly used alkylating agent such as alkyl sulfonate esters or alkyl halides. Alternatively a monomer precursor containing the desired organoammonium, organophosphonium or organosulfonium group may be polymerized to yield the desired polymer.

The organoammonium, organophosphonium or organosulfonium group in the polymer provides the desired positive charge. Generally, preferred pendant organoonium groups can be illustrated by the following structures I, II and III:

I

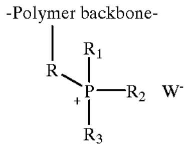

-continued

II

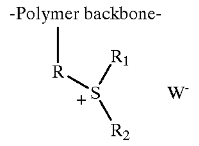

III

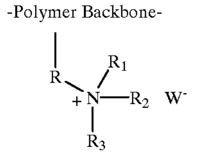

wherein R is a substituted or unsubstituted alkylene group having 1 to 12 carbon atoms that can also include one or more oxy, thio, carbonyl, amido or alkoxycarbonyl groups with the chain (such as methylene, ethylene, isopropylene, methylenephenylene, methyleneoxymethylene, n-butylene and hexylene), a substituted or unsubstituted arylene group having 6 to 10 carbon atoms in the ring (such as phenylene, naphthylene, xylylene and 3-methoxyphenylene), or a substituted or unsubstituted cycloalkylene group having 5 to 10 carbon atoms in the ring (such as 1,4-cyclohexylene, and 3-methyl-1-4-cyclohexylene). In addition, R can be combinations of two or more of the defined substituted or unsubstituted alkylene, arylene and cycloalkylene groups. Preferably, R is a substituted or unsubstituted ethyleneoxycarbonyl or phenylenemethylene group. Other useful substituents not listed herein could include combinations of any of those groups listed above as would be readily apparent to one skilled in the art.

$R_1$, $R_2$ and $R_3$ are independently substituted or unsubstituted alkyl group having 1 to 12 carbon atoms (such as methyl, ethyl, n-propyl, isopropyl, t-butyl, hexyl, hydroxymethyl, methoxymethyl, benzyl, methylenecarboalkoxy and a cyanoalkyl), a substituted or unsubstituted aryl group having 6 to 10 carbon atoms in the carbocyclic ring (such as phenyl, naphthyl, xylyl, p-methoxyphenyl, p-methylphenyl, m-methoxyphenyl, p-chlorophenyl, p-methylthiophenyl, p-N,N-dimethylaminophenyl, methoxycarbonylphenyl and cyanophenyl), or a substituted or unsubstituted cycloalkyl group having 5 to 10 carbon atoms in the carbocyclic ring (such as 1,3- or 1,4-cyclohexyl). Alternatively, any two of $R_1$, $R_2$ and $R_3$ can be combined to form a substituted or unsubstituted heterocyclic ring with the charged phosphorus, sulfur or nitrogen atom, the ring having 4 to 8 carbon, nitrogen, phosphorus, sulfur or oxygen atoms in the ring. Such heterocyclic rings include, but are not limited to, substituted or unsubstituted morpholinium, piperidinium and pyrrolidinium groups for Structure III. Other useful substituents for these various groups would be readily apparent to one skilled in the art, and any combinations of the expressly described substituents are also contemplated.

Preferably, $R_1$, $R_2$ and $R_3$ are independently substituted or unsubstituted methyl or ethyl groups.

W is any suitable anion as described above. Acetate and chloride are preferred anions.

Polymers containing quaternary ammonium groups as described herein are most preferred in the practice of this invention.

In preferred embodiments, the polymers useful in the practice of this invention can be represented by the following Structure IV:

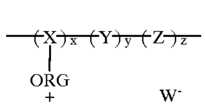

IV wherein X represents recurring units to which the organoonium groups ("ORG") are attached, Y represents recurring units derived from ethylenically unsaturated polymerizable monomers that may provide active sites for crosslinking using any of various crosslinking mechanisms (described below), and Z represents recurring units derived from any additional ethylenically unsaturated polymerizable monomers. The various recurring units are present in suitable amounts, as represented by x being from about 50 to about 99 mol %, y being from about 1 to about 20 mol %, and z being from 0 to about 49 mol %. Preferably, x is from about 80 to about 98 mol %, y is from about 2 to about 10 mol % and z is from 0 to about 18 mol %.

Crosslinking of the polymer can be achieved in a number of ways. There are numerous monomers and methods for crosslinking that are familiar to one skilled in the art. Some representative crosslinking strategies include, but are not limited to:

the reaction of an amine or carboxylic acid or other Lewis basic units with diepoxide crosslinkers, the reaction of epoxide units within the polymer with difunctional amines, carboxylic acids, or other difunctional Lewis basic unit, the irradiative or radical-initiated crosslinking of double bond-containing units such as acrylates, methacrylates, cinnamates, or vinyl groups, the reaction of multivalent metal salts with ligating groups within the polymer (the reaction of zinc salts with carboxylic acid-containing polymers is an example), the use of crosslinkable monomers that react via the Knoevenagel condensation reaction, such as (2-acetoacetoxy)ethylacrylate and methacrylate, the reaction of amine, thiol, or carboxylic acid groups with a divinyl compound [such as bis (vinylsulfonyl) methane] via a Michael addition reaction, the reaction of carboxylic acid units with crosslinkers having multiple aziridine units, the reaction of crosslinkers having multiple isocyanate units with amines, thiols, or alcohols within the polymer, mechanisms involving the formation of interchain sol-gel linkages [such as the use of the 3-(trimethoxysilyl) propylmethacrylate monomer], oxidative crosslinking using an added radical initiator (such as a peroxide or hydroperoxide), autoxidative crosslinking, such as employed by alkyd resins, sulfur vulcanization, and processes involving ionizing radiation.

Monomers having crosslinking groups or active crosslinkable sites (such as attachment sites for epoxides) can be copolymerized with the other monomers noted above. Such monomers include, but are not limited to, 3-(trimethoxysilyl)propyl acrylate or methacrylate, cinnamoyl acrylate or methacrylate, N-methoxymethyl methacrylamide, N-aminopropylacrylamide hydrochloride, acrylic or methacrylic acid and hydroxyethyl methacrylate.

Preferred crosslinking is provided by the reaction of an amine-containing pendant group (such as N-aminopropylacrylamide hydrochloride) with a difunctional or trifunctional additive, such as a bis(vinylsulfonyl) compound.

Additional monomers that provide the additional recurring units represented by "Z" in Structure IV include any useful hydrophilic or oleophilic ethylenically unsaturated polymerizable monomer that may provide desired physical or printing properties to the imaging layer. Such monomers include, but are not limited to, acrylates, methacrylates, acrylonitrile, isoprene, styrene and styrene derivatives, acrylamides, methacrylamides, acrylic or methacrylic acid and vinyl halides.

Preferred polymers useful in the practice of this invention include any of Polymer 1, Polymer 2, Polymer 3, Polymer 4, Polymer 5, Polymer 6, Polymer 7, or Polymer 8, as identified herein below. A mixture of any two or more of these polymers can also by used.

The imaging layer of the imaging member can include one or more of such homopolymers or copolymers, with or without minor amounts (less than 20 weight %) based on total dry weight of the layer of additional binder or polymeric materials that will not adversely affect its imaging properties. If a blend of polymers is used, they can comprise the same or different types of organoammonium, organophosphonium or organosulfonium groups.

The amount of heat-sensitive polymer(s) used in the imaging layer is generally at least 0.1 $g/m^2$, and preferably from about 0.1 to about 10 $g/m^2$ (dry weight). This generally provides an average dry thickness of from about 0.1 to about 10 $\mu$m.

The polymers useful in this invention are readily prepared using known reactants and polymerization techniques and chemistry described in a number of polymer textbooks. Monomers can be readily prepared using known procedures or purchased from a number of commercial sources. Several synthetic methods are provided below to illustrate how such polymers can be prepared.

The imaging layer can also include one or more conventional surfactants for coatability or other properties, or dyes or colorants to allow visualization of the written image, or any other addenda commonly used in the lithographic art, as long as the concentrations are low enough so they are inert with respect to imaging or printing properties.

Preferably, the heat-sensitive imaging layer also includes one or more photothermal conversion materials to absorb appropriate radiation from an appropriate energy source (such as an IR laser), which radiation is converted into heat. Thus, such materials convert photons into heat phonons. Preferably, the radiation absorbed is in the infrared and near-infrared regions of the electromagnetic spectrum. Such materials can be dyes, pigments, evaporated pigments, semiconductor materials, alloys, metals, metal oxides, metal sulfides or combinations thereof, or a dichroic stack of materials that absorb radiation by virtue of their refractive index and thickness. Borides, carbides, nitrides, carbonitrides, bronze-structured oxides and oxides structurally related to the bronze family but lacking the $WO_{2.9}$ component, are also useful. One particularly useful pigment is carbon of some form (for example, carbon black). The size of the pigment particles should not be more than the thickness of the layer. Preferably, the size of the particles will be half the thickness of the layer or less. Useful absorbing dyes for near infrared diode laser beams are described, for example, in U.S. Pat. No. 4,973,572 (DeBoer), incorporated herein by reference. Particular dyes of interest are "broad band" dyes, that is those that absorb over a wide band of the spectrum. Mixtures of pigments, dyes, or both, can also be used. Particularly useful infrared radiation absorbing dyes include those illustrated as follows:

IR Dye 1

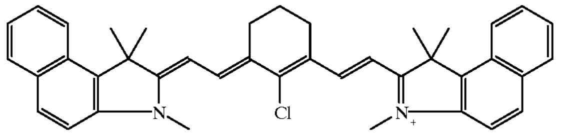

p-Toluenesulfonate$^-$

IR Dye 2

Same as Dye 1 but with $C_3F_7CO^-$ as the anion.

IR Dye 3

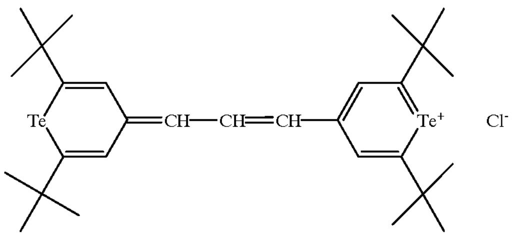

IR Dye 4

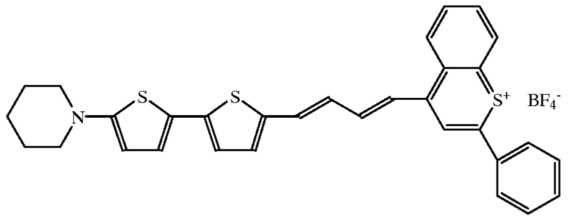

IR Dye 5

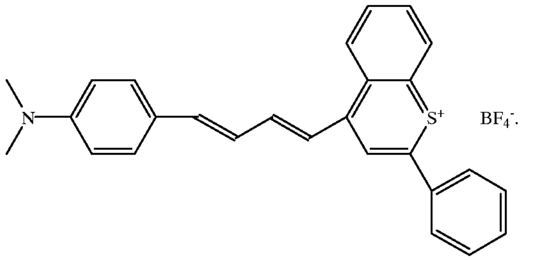

IR Dye 6

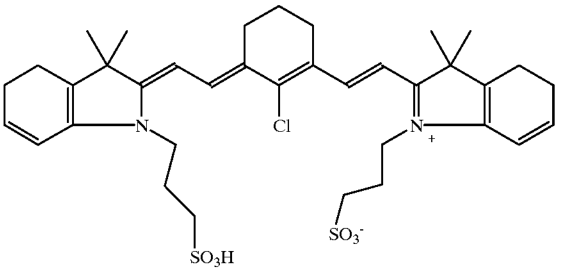

IR Dye 7

Same as Dye 1 but with chloride as the anion

The photothermal conversion material(s) are generally present in an amount sufficient to provide a transmission optical density of at least 0.2, and preferably at least 1.0, at the operating wavelength of the imaging laser. The particular amount needed for this purpose would be readily apparent to one skilled in the art, depending upon the specific material used.

Alternatively, a photothermal conversion material can be included in a separate layer that is in thermal contact with the heat-sensitive imaging layer. Thus, during imaging, the action of the photothermal conversion material can be transferred to the heat-sensitive polymer layer without the material originally being in the same layer.

The heat-sensitive composition can be applied to the support using any suitable equipment and procedure, such as spin coating, knife coating, gravure coating, dip coating or extrusion hopper coating. The composition can also be applied by spraying onto a suitable support (such as an on-press printing cylinder) as described in U.S. Pat. No. 5,713,287 (noted above).

The imaging members of this invention can be of any useful form including, but not limited to, printing plates, printing cylinders, printing sleeves and printing tapes (including flexible printing webs). Preferably, the imaging members are printing plates.

Printing plates can be of any useful size and shape (for example, square or rectangular) having the requisite heat-sensitive imaging layer disposed on a suitable support. Printing cylinders and sleeves are known as rotary printing members having the support and heat-sensitive layer in a cylindrical form. Hollow or solid metal cores can be used as substrates for printing sleeves.

During use, the imaging member of this invention is exposed to a suitable source of energy that generates or provides heat, such as a focused laser beam or a thermoresistive head, in the foreground areas where ink is desired in the printed image, typically from digital information supplied to the imaging device. No additional heating, wet processing, or mechanical or solvent cleaning is needed before the printing operation. A laser used to expose the imaging member of this invention is preferably a diode laser, because of the reliability and low maintenance of diode laser systems, but other lasers such as gas or solid state lasers may also be used. The combination of power, intensity and exposure time for laser imaging would be readily apparent to one skilled in the art. Specifications for lasers that emit in the near-IR region, and suitable imaging configurations and devices are described in U.S. Pat. No. 5,339,737 (Lewis et al), incorporated herein by reference. The imaging member is typically sensitized so as to maximize responsiveness at the emitting wavelength of the laser. For dye sensitization, the dye is typically chosen such that its $\lambda_{max}$ closely approximates the wavelength of laser operation.

The imaging apparatus can operate on its own, functioning solely as a platemaker, or it can be incorporated directly into a lithographic printing press. In the latter case, printing may commence immediately after imaging, thereby reducing press set-up time considerably. The imaging apparatus can be configured as a flatbed recorder or as a drum recorder, with the imaging member mounted to the interior or exterior cylindrical surface of the drum.

In the drum configuration, the requisite relative motion between the imaging device (such as a laser beam) and the imaging member can be achieved by rotating the drum (and the imaging member mounted thereon) about its axis, and moving the imaging device parallel to the rotation axis, thereby scanning the imaging member circumferentially so the image "grows" in the axial direction. Alternatively, the thermal energy source can be moved parallel to the drum axis and, after each pass across the imaging member, increment angularly so that the image "grows" circumferentially.

In both cases, after a complete scan by the laser beam, an image corresponding to the original document or picture can be applied to the surface of the imaging member.

In the flatbed configuration, the laser beam is drawn across either axis of the imaging member, and is indexed along the other axis after each pass. Obviously, the requisite relative motion can be produced by moving the imaging member rather than the laser beam.

In a preferred embodiment of this invention, imaging efficiency can be improved by using a focused laser beam having an intensity of at least 0.1 mW/$\mu$m$^2$ for a time sufficient to provide a total exposure of as little as 100 mJ/cm$^2$. It has been found that exposures of higher intensity and shorter time are more efficient because the laser heating becomes more adiabatic. That is, higher temperatures can be attained because conductive heat loss is minimized.

While laser imaging is preferred in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al). Thermal print heads are commercially available (for example, as Fujisu Thermal Head FTP-040 MCS001 and TDK Thermal Head F415 HH7-1089).

Without the need for any wet processing after imaging, printing can then be carried out by applying a lithographic ink and fountain solution to the imaging member printing surface, and then transferring the ink to a suitable receiving material (such as cloth, paper, metal, glass or plastic) to provide a desired impression of the image thereon. If desired, an intermediate "blanket" roller can be used to transfer the ink from the imaging member to the receiving material. The imaging members can be cleaned between impressions, if desired, using conventional cleaning means.

The following examples illustrate the practice of the invention, and are not meant to limit it in any way.

Synthetic Methods

Preparation of Polymer 1: Poly[methyl methacrylate-co-2-trimethylammoniumethyl methacrylic chloride-co-N-(3-aminopropyl) methacrylamide hydrochloride] (7:2:1 molar ratio)

Methyl methacrylate (24.6 ml, 0.23 mol), 2-trimethylammoniumethyl methacrylic chloride (17.0 g, 0.08 mol), n-(3-aminopropyl) methacrylamide hydrochloride (10.0 g, 0.56 mol), azobisisobutyronitrile (0.15 g, 9.10x10$^{-4}$ mol, AIBN), water (20 ml) and dimethylformamide (150 ml) were combined in a round bottom flask fitted with a rubber septum. The solution was bubble degassed with nitrogen for 15 minutes and placed in a heated water bath at 60° C. overnight. The viscous product solution was diluted with methanol (125 ml) and precipitated three times from methanol into isopropyl ether. The product was dried under vacuum at 60° C. for 24 hours and stored in a dessicator.

Preparation of Polymer 2: Poly[methyl methacrylate-co-2-trimethylammoniumethyl methacrylic acetate-co-N-(3-aminopropyl) methacrylamide] (7:2:1 molar ratio)

Polymer 1 (3.0 g) was dissolved in 100 ml of methanol and neutralized by passing through a column containing 300 cm$^3$ of tertiary amine functionalized crosslinked polystyrene resin (Scientific Polymer Products #726, 300 cm$^2$) with methanol eluent. That polymer was then converted to the acetate using a column of 300 cm$^3$ DOWEX® 1x8–100 ion exchange resin (that is, converted from the chloride to the acetate by washing with 500 ml glacial acetic acid) and methanol eluent.

Preparation of Polymer 3: Poly[methyl methacrylate-co-2-trimethylammoniumethyl methacrylic fluoride-co-N-(3-aminopropyl) methacrylamide hydrochloride] (7:2:1 molar ratio)

Polymer 1 (3.0 g) was dissolved in 100 ml of methanol and neutralized by passing through a column containing 300 cm$^3$ tertiary amine functionalized crosslinked polystyrene resin (Scientific Polymer Products #726, 300 cm$^2$) with methanol eluent. The polymer was then converted to the fluoride using a column of 300 cm$^3$ DOWEX® 1x8–100 ion exchange resin (that is, converted from the chloride to the fluoride by washing with 500 g of potassium fluoride) and methanol eluent.

Preparation of Polymer 4: Poly[vinylbenzyl trimethylammonium chloride-co-N-(3-aminopropyl) methacrylamide hydrochloride] (19:1 molar ratio)

Vinylbenzyl trimethylammonium chloride (19 g, 0.0897 mol, 60:40 mixture of p,m isomers), N-(3-aminopropyl) methacrylamide hydrochloride (1 g, 0.00562 mol), 2,2'-azobis(2-methylpropionamidine) dihydrochloride (0.1 g), and deionized water (80 ml) were combined in a round bottom flask fitted with a rubber septum. The reaction mixture was bubble degassed with nitrogen for 15 minutes and placed in a water bath at 60° C. for four hours. The resulting viscous product solution was precipitated into acetone, dried under vacuum at 60° C. for 24 hours, and stored in a dessicator.

Preparation of Polymer 5: Poly ([vinylbenzyltrimethylphosphonium acetate-co-N-(3-aminopropyl) methacrylamide hydrochloride] (19:1 molar ratio)

A] Vinylbenzyl bromide (60:40 mixture of p,m isomers):

Vinylbenzyl chloride (50.60 g, 0.33 mol, 60:40 mixture of p,m isomers), sodium bromide (6.86 g, 6.67x10$^{-2}$ mol), N-methylpyrrolidone (300 ml, passed through a short column of basic alumina), ethyl bromide (260 g), and 3-t-butyl-4-hydroxy-5-methyl phenyl sulfide (1.00 g, 2.79x10$^{-3}$ mol) were combined in a 1 liter round bottomed flask fitted with a reflux condenser and a nitrogen inlet and the mixture was heated at reflux for 72 hours at which point the reaction was found to have proceeded to >95% conversion by gas chromatography. The reaction mixture was poured into 1 liter of water and extracted twice with 300 ml of diethyl ether. The combined ether layers were extracted twice with 1 liter of water, dried over $MgSO_4$, and the solvents were stripped by rotary evaporation to yield a yellowish oil. The crude product was purified by vacuum distillation to afford 47.5 g of product (53.1% yield).

B] Vinylbenzyl trimethylphosphonium bromide:

Trimethylphosphine (50.0 ml of a 1.0 molar solution in tetrahydrofuran, 5.00x10$^{-2}$ mol) was added via addition funnel over about 2 minutes into a thoroughly nitrogen degassed dispersion of vinylbenzyl bromide (9.85 g, 5.00x10$^{-2}$ mol) in diethyl ether (100 ml). A solid precipitate began to form almost immediately. The reaction was allowed to stir for 4 hours at room temperature, then was placed in a freezer overnight. The solid product was isolated by filtration, washed three times with 100 ml of diethyl ether, and dried under vacuum for 2 hours. Pure product (11.22 g) was recovered as a white powder (82.20% yield).

C] Poly [vinylbenzyltrimethylphosphonium bromide-co-N-(3-aminopropyl)methacrylamide] (19:1 molar ratio):

Vinylbenzyltrimethylphosphonium bromide (5.00 g, 1.83x10$^{-2}$ mol), N-(3-aminopropyl) methacrylamide hydrochloride (0.17 g, 9.57x10$^{-4}$ mol), azobisisobutyronitrile (0.01 g, 6.09x10$^{-5}$ mol), water (5.0 ml), and dimethylformamide (25 ml) were combined in a 100 ml round bottomed flask sealed with a rubber septum, bubble degassed for 10 minutes with nitrogen, and placed in a warm water bath (55° C.) overnight. The viscous solution was precipitated into tetrahydrofuran and dried under vacuum overnight at 60° C. The liquids were filtered off, concentrated on a rotary evaporator to a volume of about 200 ml, precipitated again into tetrahydrofuran, and dried under vacuum overnight at 60° C. About 4.20 g was recovered. (81.9% yield).

D] Poly [vinylbenzyltrimethylphosphonium acetate-co-N-(3-aminopropyl) methacrylamide hydrochloride] (19:1 molar ratio):

DOWEX® 550 a hydroxide anion exchange resin (about 300 $cm^3$) was poured into a flash column with 3:1 methanol/water eluent. About 1 liter of glacial acetic acid was passed through the column to convert it to the acetate, followed by about 3 liters of 3:1 methanol/water. 3.0 g of the product from step C in 200 ml of 3:1 methanol/water was passed through the acetate resin column and the solvents were stripped on a rotary evaporator. The resulting viscous oil was thoroughly dried under vacuum to afford 2.02 g of a glassy, yellowish material (Polymer 5, 67.9% yield). Ion chromatography showed complete conversion to the acetate.

Preparation of Polymer 6: Poly [dimethyl-2-(methacryloyloxy) ethylsulfonium chloride-co-N-(3-aminopropyl) methacrylamide hydrochloride] (19:1 molar ratio)

A] Dimethyl-2-(methacryloyloxy) ethylsulfonium methylsulfate:

2-(Methylthio) ethylmethacrylate (30.00 g, 0.19 mol), dimethyl sulfate (22.70 g, 0.18 mol), and benzene (150 ml) were combined in a 250 ml round bottomed flask outfitted with a reflux condenser and a nitrogen inlet. The reaction solution was heated at reflux for 1.5 hours and allowed to stir at room temperature for 20 hours at which point the reaction had proceeded to about 95% yield by $^1H$ NMR. The solvent was removed by rotary evaporation to afford a brownish oil which was stored as a 20 wt. % solution in dimethylformamide and used without further purification.

B] Poly [dimethyl-2-(methacryloyloxy) ethylsulfonium methylsulfate-co-N-(3-aminopropyl) methacrylamide hydrochloride] (19:1 molar ratio):

Dimethyl-2-(methacryloyloxy) ethylsulfonium methylsulfate (93.00 g of 20 wt. % solution in dimethylformamide, $6.40\times10^{-2}$ mol), N-(3-aminopropyl) methacrylamide hydrochloride (0.60 g, $3.36\times10^{-3}$ mol), and azobisisobutyronitrile (0.08 g, $4.87\times10^{-4}$ mol) were dissolved in methanol (100 ml) in a 250 ml round bottomed flask fitted with a septum. The solution was bubble degassed with nitrogen for 10 minutes and heated for 20 hours in a warm water bath at 55° C. The reaction was precipitated into ethyl acetate, redissolved in methanol, precipitated a second time into ethyl acetate, and dried under vacuum overnight. A white powder (15.0 g) was recovered (78.12% yield).

C] Poly [dimethyl-2-(methacryloyloxy) ethylsulfonium chloride-co-N-(3-aminopropyl) methacrylamide hydrochloride] (19:1 molar ratio):

The precursor polymer (2.13 g) from step B was dissolved in 100 ml of 4:1 methanol/water and passed through a flash column containing 300 $cm^3$ of DOWE® 1x8–100 anion exchange resin using 4:1 methanol/water eluent. The recovered solvents were concentrated to about 30 ml and precipitated into 300 ml of methyl ethyl ketone. The damp, white powder collected was redissolved in 15 ml of water and stored in a refrigerator as a solution of Polymer 6 (10.60% solids).

Preparation of Polymer 7: Poly [vinylbenzyldimethylsulfonium methylsulfate]

A] Methyl (vinylbenzyl) sulfide:

Sodium methanethiolate (24.67 g, 0.35 mol) was combined with methanol (250 ml) in a 1 liter round bottomed flask outfitted with an addition funnel and a nitrogen inlet. Vinylbenzyl chloride (41.0 ml, 60:40 mixture of p and o isomers, 0.29 mol) in tetrahydrofuran (100 ml) was added via addition funnel over 30 minutes. The reaction mixture grew slightly warm and a milky suspension resulted. This was allowed to stir at room temperature for 20 hours at which point only a small amount of vinylbenzyl chloride was still evident by thin layer chromatography (2:1 hexanes/$CH_2Cl_2$ eluent). Another portion of sodium methanethiolate was added (5.25 g, $7.49\times10^{-2}$ mol) and after ten minutes, the reaction had proceeded to completion by TLC. Diethyl ether (400 ml) was added and the resulting mixture was extracted twice with 600 ml of water and once with 600 ml of brine. The resulting organic extracts were dried over magnesium sulfate, a small amount (about 1 mg) of 3-t-butyl-4-hydroxy-5-methyl phenyl sulfide was added, and the solvents were stripped by rotary evaporation to afford a yellowish oil. Purification by vacuum distillation through a long Vigreux column yielded 43.35 g (91%) of the pure product as a clear liquid.

B] Dimethyl (vinylbenzyl) sulfonium methylsulfate:

Methyl (vinylbenzyl) sulfide (13.59 g, $8.25\times10^{-2}$ mol), benzene (45 ml), and dimethyl sulfate (8.9 ml, $9.4\times10^{-2}$mol) were combined in a 100 ml round bottomed flask equipped with a nitrogen inlet and allowed to stir at room temperature for 44 hours, at which point two layers were present. Water (20 ml) was added and the top (benzene) layer was removed by pipette. The aqueous layer was extracted three times with 30 ml of diethyl ether and a vigorous stream of nitrogen was bubbled through the solution to remove residual volatile compounds. The product was used without further purification as a 35% (w/w) solution.

C] Poly [dimethyl (vinylbenzyl) sulfonium methylsulfate]:

All of the dimethyl (vinylbenzyl) sulfonium methylsulfate solution from the previous step (approximately $5.7\times10^{-2}$ mol) was combined with water (44 ml) and sodium persulfate (0.16 g, $6.72\times10^{-4}$ mol) in a 200 ml round bottomed flask fitted with a rubber septum. The reaction solution was bubble degassed with nitrogen for ten minutes and heated for 24 hours in a water bath at 50° C. As the solution did not appear viscous, additional sodium persulfate (0.16 g, $6.72\times10^{-4}$ mol) was added and the reaction was allowed to proceed for 18 more hours at 50° C. The solution was precipitated into acetone and immediately redissolved in water to give 100 ml of a solution of Polymer 7 (11.9% solids).

Preparation of Polymer 8: Poly [vinylbenzyldimethylsulfonium chloride]

The aqueous product solution of Polymer 7 (16 ml, ~4.0 g solids) was precipitated into a solution of benzyltrimethylammonium chloride (56.0 g) in isopropanol (600 ml). The solvents were decanted and the solids were washed by stirring for 10 minutes in 600 ml of isopropanol and quickly dissolved in water to give 35 ml of a solution of Polymer 8 (11.1% solids). Analysis by ion chromatography showed >90% conversion to the chloride.

EXAMPLE 1

Printing Plate Prepared Using Polymer 2

Polymer 2 (0.202 g) was dissolved in 9.0 g of 1:1 methanol/tetrahydrofuran and combined with 0.694 g of a carbon dispersion (8.75% by weight in 2-butanone)* with vigorous stirring. Just prior to coating, 2.025 g of a 1.80% (by weight) aqueous solution of bis(vinylsulfonyl)methane (BVSM) was added with good stirring and the black dispersion was immediately coated onto a 150 μm thick grained, anodized aluminum support at a wet coverage of 76 $g/m^2$.

* The carbon dispersion in 2-butanone was made by combining the following materials in a 16 oz glass container:
16 g of Raven 1200 carbon
2 g of Solsperse 24000 dispersing aid
4 g of polyvinyl acetal KS-1
930 g of zirconium oxide beads (1 mm diameter)
126 g of 2-butanone
The container was sealed, placed on a roller mill, and rolled for 147 hours. The dispersion was poured into a paint strainer held within a funnel to separate the beads from the dispersion. The container and beads were rinsed with two portions of approximately 30–40 ml of 2-butanone, and the rinses being combined with the bulk of the solution. Analysis of the dispersion gave percent solids as 12.04%. The carbon content is calculated to be 8.75% (by weight) of the total dispersion.

After drying, the printing plate was exposed in a platesetter having an array of laser diodes operating at a wavelength of 830 nm each focused to a spot diameter of 17 μm. Each channel provided a maximum of 600 mW of power incident on the recording surface. A similar apparatus is described in U.S. Pat. No. 5,446,477 (Baek et al). The exposure level was controlled by the laser intensity and the rotation rate of the rotating drum on which the printing plate was mounted, and was about 1000 $mJ/cm^2$. The intensity of the beam was about 3 $mW/\mu m^2$. The laser beam was modulated to produce a halftone dot image. The imaged plate was placed under running water and rubbed with Van Son Diamond Black ink using a cloth wet with water. The imaged (exposed) areas of the printing plate took ink readily while the non-imaged (unexposed background) areas took no ink.

The printing plate was put on a commercial A. B. Dick 9870 duplicator press and used for printing using O/S Kodak 1.5 ml medium black ink, manufactured by Graphic Ink Co., Inc., and Varn Litho Etch 142W fountain solution with PAR alcohol replacement. Approximately 100 prints of acceptable quality were obtained.

EXAMPLE 2

Printing Plate Prepared Using Polymer 3

Polymer 3 (0.202 g) was dissolved in 9.0 g of 1:1 methanol/tetrahydrofuran and combined with 0.705 g of a carbon dispersion (8.75% by weight in 2-butanone, as described above) with vigorous stirring. Just prior to coating, 2.025 g of a 1.80% (by weight) aqueous solution of BVSM was added with good stirring and the black dispersion was immediately coated onto a 150 μm thick grained, anodized aluminum support at a wet coverage of 76 $g/m^2$.

After drying, the printing plate was exposed at about 1000 $mJ/cm^2$ as described in Example 1. The laser beam was modulated to produce a halftone dot image. The imaged printing plate was placed under running water and rubbed with Van Son Diamond Black ink using a cloth wet with water. The imaged (exposed) areas of the plate took ink readily while the non-imaged (unexposed background) areas took no ink.

The plate was put on a commercial A. B. Dick 9870 duplicator press. O/S Kodak 1.5 ml medium black ink, manufactured by Graphic Ink Co., Inc., and Varn Litho Etch 142W fountain solution with PAR alcohol replacement was used for printing. Approximately 100 prints of acceptable quality were obtained.

EXAMPLE 3

Carbon Sensitized Printing Plate Prepared Using Polymer 4

Polymer 4 (0.452 g) was dissolved in a 3:1 mixture (w/w, 8.62 g) of water and methanol. A dispersion of carbon black in water [carbon particles having quaternary amines on the surface (prepared as described by Johnson, IS&T's $50^{th}$ Annual Conference, Cambridge, Mass., May 18–23, 1997, pp. 310–312)], 15.2% solids in water, 0.301 g) was added. After mixing and just before coating, a solution of BVSM (0.627 g, 1.8% by weight in water) was added, and the resulting mixture was coated using a conventional wire wound rod to a wet thickness of 0.0254 mm on both a gelatin subbed poly(ethylene terephthalate) film support (Printing Plate A) and a grained and anodized aluminum support (Printing Plate B). The coatings were dried for four minutes at 70–80° C. The resulting dry coating coverages were Polymer 4 at 1.08 $g/m^2$, carbon black at 0.108 $g/m^2$ and BVSM at 0.027 $g/m^2$.

The printing plates were exposed in an experimental platesetter similar to that of Example 1. The device employs an array of laser diodes operating at a wavelength of 830 nm each focused to a spot diameter of 23 μm. Each channel provides a maximum of 450 mW of power incident on the recording surface. The plates were mounted on a drum whose rotation speed was varied to provide for a series of images set at various exposures as listed in TABLE I below. The laser beams were modulated to produce halftone dot images.

TABLE I

| PRINTING PLATE | IMAGING POWER (mW) | IMAGING EXPOSURE ($mJ/cm^2$) |
|---|---|---|
| A | 450 | 565 |
| A | 450 | 702 |
| A | 450 | 928 |
| A | 450 | 1365 |
| B | 450 | 565 |
| B | 450 | 702 |
| B | 450 | 928 |
| B | 450 | 1365 |

The printing plates were mounted on a commercial A. B. Dick 9870 duplicator press and impressions (prints) were made using VanSon Diamond Black lithographic printing ink and Universal Pink fountain solution containing PAR alcohol substitute (Varn Products Company). The exposed areas of the printing plates readily accepted ink and printed about 1000 impressions of acceptable quality. The non-imaged areas of the printing plates did not wash off during printing, indicating that effective adhesion and crosslinking were achieved during plate fabrication.

COMPARATIVE EXAMPLE 1

Printing plates on both polyethylene terephthalate and aluminum supports were prepared as described in Example 3 except that the BVSM crosslinking agent was omitted from the coating formulation. After coating and drying, samples of these Control printing plates were moved about in distilled water along with samples of the Example 3 printing plates. The imaging layers of the Control printing plates washed off the supports, while the imaging layers of the Example 3 printing plates remained intact.

The Control printing plates were imaged, and mounted on a printing press as described in Example 3. Early in the press run, the fountain solution could be seen to be washing the carbon black containing coatings off the unexposed areas of both types of Control printing plates.

EXAMPLE 4

Dye Sensitized Printing Plate Prepared Using Polymer 4

Polymer 4 (0.254 g) and IR Dye 7 (0.025 g) were dissolved in a 3:1 mixture (w/w, 4.37 g) of methanol and water. After mixing and just before coating, a solution of BVSM (0.353 g, 1.8% by weight in water) was added, and the resulting solution was coated using a conventional wire wound rod to a wet thickness of 0.0254 mm on a gelatin subbed poly(ethylene terephthalate) film support. The coatings were dried for four minutes at 70–80° C. The resulting dry coating coverages were Polymer 4 at 1.08 $g/m^2$, IR Dye 7 at 0.108 $g/m^2$ and BVSM at 0.027 $g/m^2$.

The resulting printing plates were exposed as described in Example 3. The plates were mounted on a drum whose rotation speed was varied to provide for a series of images set at various exposures as listed in TABLE II below.

TABLE II

| PRINTING PLATE IMAGE | IMAGING POWER (mW) | IMAGING EXPOSURE ($mJ/cm^2$) |
|---|---|---|
| 1 | 356 | 350 |
| 2 | 356 | 460 |
| 3 | 356 | 600 |
| 4 | 356 | 900 |

The printing plates were mounted on a commercial A. B. Dick 9870 duplicator press and impressions (prints) were made using VanSon Diamond Black lithographic printing ink and Universal Pink fountain solution containing PAR alcohol substitute (Varn Products Company). The exposed areas of the printing plates readily accepted ink and printed about 1000 impressions of acceptable quality throughout the exposure series. The non-imaged areas of the plates did not wash off during printing, indicating that effective adhesion and cross-linking were attained in the plate formulation.

EXAMPLE 5

Printing Plate Prepared from Polymer 5

A coating formulation was prepared by dissolving 0.678 g of Polymer 5 in 12.9 g of a mixture of water and methanol (3/1 w/w). The dispersion of carbon of Example 3 (0.452 g, 15 weight % carbon) was added. After mixing and just before coating, a solution of bis-vinylsulfonylmethane (BVSM, 0.941 g, 1.8% by weight in water) was added and the formulation was coated with a wire wound rod on a K Control Coater (Model K202, RK Print-Coat Instruments LTD) to a wet thickness of 25 μm on gel subbed poly (ethylene terephthalate) support. The coatings were dried in an oven for four minutes at 70–80° C. The coverage data are summarized in TABLE III below.

Two printing plates were exposed in an experimental platesetter that employs an array of laser diodes operating at a wavelength of 830 nm, each focused to a spot diameter of 23 μm. Each channel provided a maximum of 450 mW of power incident on the recording surface. A similar apparatus is described in U.S. Pat. No. 5,446,477 (Baek et al). The plates were mounted on a drum whose rotation speed was varied to provide for a series of images set at various exposures as listed in TABLE III below. The laser beams were modulated to produce halftone dot images.

TABLE III

| | Coverage ($g/m^2$) | | | Imaging conditions | |
|---|---|---|---|---|---|
| | | | | Power | Exposure |
| Plate # | Polymer | Carbon | BVSM | (mW) | ($mJ/cm^2$) |
| 1 | 1.08 | 0.108 | 0.027 | 356 | 360 |
| " | " | " | " | " | 450 |
| " | " | " | " | " | 600 |
| " | " | " | " | " | 900 |
| 2 | " | " | " | 450 | 565 |
| " | " | " | " | " | 702 |
| " | " | " | " | " | 928 |
| " | " | " | " | " | 1365 |

The printing plates were mounted on a commercially available A. B. Dick 9870 duplicator press and prints were made using VanSon Diamond Black ink and Universal Pink fountain solution containing PAR alcohol substitute (Varn Products Company, Inc.). The plates gave acceptable negative images at all imaging conditions to at least 500 impressions. The non-imaged areas of the plates did not wash off during printing, indicating that effective adhesion and cross-linking was attained in the plate formulation

EXAMPLE 6

Printing Plate Prepared from Polymer 6

A coating formulation was prepared by diluting a 10.6% aqueous solution of Polymer 6 with water and methanol so as to provide a melt containing 0.678 g of polymer in 12.9 g of a mixture of water and methanol (3/1 w/w). The dispersion of carbon of Example 3 (0.452 g, 15 weight % carbon) was added. After mixing and just before coating, a solution of BVSM (0.941 g, 1.8% by weight in water) was added and the formulation was coated with a wire wound rod on a K Control Coater (Model K202, RK Print-Coat Instruments LTD) to a wet thickness of 25 μm on gelatin-subbed polyester as in Example 5. The coatings were dried in an oven for four minutes at 70–80° C. The coverage data are summarized in TABLE IV below.

As in Example 5, the plates were imaged on an experimental platesetter with a diode laser operating at a wavelength of 830 nm. The plates were mounted on a drum whose rotation speed was modified to provide for a series of images set at various exposures (See TABLE IV).

TABLE IV

| | Coverage ($g/m^2$) | | | Imaging conditions | |
|---|---|---|---|---|---|
| | | | | Power | Exposure |
| Plate # | Polymer | Carbon | BVSM | (mW) | ($mJ/cm^2$) |
| 3 | 1.08 | 0.108 | 0.027 | 356 | 360 |
| " | " | " | " | " | 450 |
| " | " | " | " | " | 600 |
| " | " | " | " | " | 900 |
| 4 | " | " | " | 450 | 565 |
| " | " | " | " | " | 702 |
| " | " | " | " | " | 928 |
| " | " | " | " | " | 1365 |

The plates were mounted on a commercially available A. B. Dick 9870 duplicator press and prints were made using VanSon Diamond Black ink and Universal Pink fountain solution containing PAR alcohol substitute (Varn Products Company, Inc.). The plates gave acceptable negative images at all exposure levels to at least 500 impressions. The non-imaged areas of the plates did not wash off during printing, indicating that effective adhesion and cross-linking was attained in the plate formulation.

EXAMPLE 7

Printing Plate Prepared from Polymer 7

A coating formulation was prepared by diluting a 11.9% aqueous solution of Polymer 7 with water and methanol so as to provide a melt containing 0.678 g of polymer in 12.9 g of a mixture of water and methanol (3/1 w/w). The dispersion of carbon of Example 3 (0.452 g, 15 weight % carbon) was added. After mixing, the formation was coated with a wire wound rod on a K Control Coater (Model K202, RK Print-Coat Instruments LTD) to a wet thickness of 25 μm on the support of Example 5. The coatings were dried in an oven for four minutes at 70–80° C. The coverage data are summarized in TABLE V below.

As in Example 5, the plates were imaged on an experimental plate setter with a diode laser operating at a wavelength of 830 nm. The plates were mounted on a drum whose rotation speed was modified to provide for a series of images set at various exposures (See TABLE V).

TABLE V

| | Coverage ($g/m^2$) | | | Imaging conditions | |
|---|---|---|---|---|---|
| | | | | Power | Exposure |
| Plate # | Polymer | Carbon | BVSM | (mW) | ($mJ/cm^2$) |
| 5 | 1.08 | 0.108 | none | 356 | 360 |
| " | " | " | " | " | 450 |
| " | " | " | " | " | 600 |
| " | " | " | " | " | 900 |
| 6 | " | " | " | 450 | 565 |
| " | " | " | " | " | 702 |
| " | " | " | " | " | 928 |
| " | " | " | " | " | 1365 |

The plates were mounted on a commercially available A. B. Dick 9870 duplicator press and prints were made using VanSon Diamond Black ink and Universal Pink fountain solution containing PAR alcohol substitute (Varn Products Company, Inc.). The plates gave acceptable negative images at the highest exposure level of Plate 5 and the three highest exposure levels of Plate 6 to at least 500 impressions.

EXAMPLE 8

Printing Plate Prepared from Polymer 8

A coating formulation was prepared by diluting a 11.1% aqueous solution of Polymer 8 with water and methanol so as to provide a melt containing 0.678 g of polymer in 12.9 g of a mixture of water and methanol (3/1 w/w). The dispersion of carbon of Example 3 (0.452 g, 15 weight % carbon) was added. After mixing, the formulation was coated with a wire wound rod on a K Control Coater (Model K202, RK Print-Coat Instruments LTD) to a wet thickness of 25 pm on the support of Example 5. The coatings were dried in an oven for four minutes at 70–80° C. The coverage data are summarized in TABLE VI.

As in Example 5, the plates were imaged on an experimental plate setter with a diode laser operating at a wavelength of 830 nm. The plates were mounted on a drum whose rotation speed was modified to provide for a series of images set at various exposures (See TABLE VI).

TABLE VI

| | Coverage ($g/m^2$) | | | Imaging conditions | |
|---|---|---|---|---|---|
| | | | | Power | Exposure |
| Plate # | Polymer | Carbon | BVSM | (mW) | ($mJ/cm^2$) |
| 7 | 1.08 | 0.108 | none | 356 | 360 |
| " | " | " | " | " | 450 |
| " | " | " | " | " | 600 |
| " | " | " | " | " | 900 |
| 8 | " | " | " | 450 | 565 |
| " | " | " | " | " | 702 |
| " | " | " | " | " | 928 |
| " | " | " | " | " | 1365 |

The plates were mounted on a commercially available A. B. Dick 9870 duplicator press and prints were made using VanSon Diamond Black ink and Universal Pink fountain solution containing PAR alcohol substitute (Varn Products Company, Inc.). The plates gave acceptable negative images at all exposure levels to at least 500 impressions.

EXAMPLE 9

Printing Plate Imaged Using Thermoresistive Head

Polymer 4 (1.52 g) was dissolved in a 3:1 mixture (w/w, 26.4 g) of methanol and water. After mixing and just before coating, a solution of BVSM (2.11 g, 1.8% by weight in water) was added, and the resulting mixture was coated as an imaging layer using a conventional wire wound rod to a wet thickness of 25 μm on a grained and anodized aluminum support. The coating was dried for four minutes at 70–80° C. The resulting dry coating coverages were Polymer 4 at 1.08 $g/m^2$ and BVSM at 0.027 $g/m^2$. Half of the coated plate was heated to 200° C. using an Insta Heat Seal Machine (Insta Machine Corp.) for one minute while the other half was left unheated.

The printing plate was mounted on a commercial A.B. Dick 9870 duplicator press and impressions were made using VanSon Diamond Black lithographic printing ink and Universal Pink fountain solution containing PAR alcohol substitute (Varn Products Company). The heated half of the coated plate readily accepted ink while the unheated half did not accept ink. An image of the heated area of the plate was generated. At least 1000 impressions were obtained where high ink density was printed from the heated area of the plate and little or no ink density was printed from the unheated area of the plate. The coated layer from the heated or the unheated areas of the plate did not wash or wear off during printing, indicating that effective adhesion and cross-linking were attained in the plate formulation.

The invention has been described in detail with particular reference to preferred embodiments thereof, but it will be understood that variations and modifications can be effected within the spirit and scope of the invention.

We claim:

1. An imaging member comprising a support having thereon a hydrophilic imaging layer comprising a hydrophilic heat-sensitive crosslinked vinyl polymer which is thermally switchable the polymer comprising repeating units comprising organoonium groups wherein post-imaging wet processing of the imaging member is not required.

2. The imaging member of claim 1 further comprising a photothermal conversion material.

3. The imaging member of claim 2 wherein said photothermal conversion material is an infrared radiation absorbing material and is present in said imaging layer.

4. The imaging member of claim 2 wherein said photothermal conversion material is carbon black or an infrared radiation absorbing dye.

5. The imaging member of claim 1 wherein said imaging member has a polyester or aluminum support.

6. The imaging member of claim 1 wherein said heat-sensitive polymer has organosulfonium or organophosphonium groups.

7. The imaging member of claim 6 wherein said heat-sensitive polymer is represented by either of structures I or II:

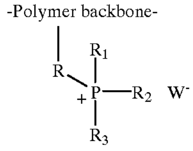

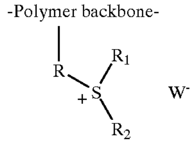

wherein R is an alkylene, arylene, or cycloalkylene group or a combination of two or more such groups, $R_1$, $R_2$ and $R_3$ are independently substituted or unsubstituted alkyl, aryl or cycloalkyl groups, or any two of $R_1$, $R_2$ and $R_3$ can be combined to form a heterocyclic ring with the charged phosphorus or sulfur atom, and $W^-$ is an anion.

8. The imaging member of claim 7 wherein R is an ethyleneoxycarbonyl or phenylenemethylene group, and $R_1$, $R_2$ and $R_3$ are independently a methyl or ethyl group.

9. The imaging member of claim 7 wherein $W^-$ is a halide or carboxylate.

10. The imaging member of claim 1 wherein said heat-sensitive polymer has organoammonium groups.

11. The imaging member of claim 10 wherein said heat-sensitive polymer is represented by structure III:

III

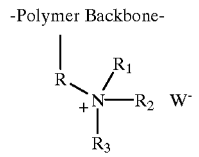

wherein R is an alkylene, arylene or cycloalkylene group or a combination of two or more of such groups, $R_1$, $R_2$ and $R_3$ are independently an alkyl, aryl, cycloalkyl group, or any two of $R_1$, $R_2$ and $R_3$ can be combined to form a heterocyclic ring with the charged nitrogen atom.

12. The imaging member of claim 11 wherein R is an ethyleneoxycarbonyl or phenylenemethylene group, and $R_1$, $R_2$ and $R_3$ are independently a methyl or ethyl group, and W is a halide or carboxylate.

13. The imaging member of claim 1 wherein said vinyl polymer is a copolymer having recurring units derived from one or more additional ethylenically unsaturated polymerizable monomers, at least one of which monomers provides crosslinking sites.

14. The imaging member of claim 13 represented by the structure IV:

IV

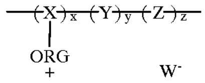

wherein ORG represents organoonium groups, X represents recurring units to which the ORG groups are attached, Y represents recurring units derived from ethylenically unsaturated polymerizable monomers that may provide active sites for crosslinking, Z represents recurring units derived from any additional ethylenically unsaturated polymerizable monomers, x is from about 50 to about 99 mol %, y is from about 1 to about 20 mol %, and z is from 0 to about 49 mol %.

15. The imaging member of claim 14 wherein x is from about 80 to about 98 mol %,y is from about 2 to about 10 mol % and z is from 0 to about 18 mol %.

16. The imaging member of claim 1 wherein said imaging layer is the sole layer on said support.

17. The imaging member of claim 1 wherein said heat sensitive crosslinked vinyl polymer is selected from the group consisting of poly(methyl methacrylate-co-2-trimethylammoniumethyl methacrylic chloride-co-N-(3-aminopropyl) methacrylamide hydrocholoride), poly (methvl methacrylate-co-2-trimethylammoniumethyl methacrylic acetate-co-N-(3-aminopropyl) methacrylamide). poly(methyl methalcrylate-co-2-trimethylammoniumethyl methacrylic fluoride-co-N-(3-aminopropyl) methacrylamide hydrochloride), poly (vinylbenzyl trimethylammonium chloride-co-N-(3-aminopropyl) methacrylamide hvdrochloride), poly (vinylbenzyltrimethylphosphonium acetate-co-N-(3-aminopropyl) methacrylamide hydrochloride), poly (dimethyl-2-(methacryloyloxy) ethylsulfonium chloride-co-N-(3-aminopropyl) methacrylamide hydrochloride), poly (vinylbenzyldimethylsulfonium methylsulfate), and poly (vinylbenzyldimethvlsulfonium chloride) or mixtures thereof.

18. The imaging member of claim 1 wherein said support is an on-press printing cylinder.

19. A method of imaging comprising the steps of:

A) providing the imaging member of claim 1, and

B) imagewise exposing said imaging member to energy to provide exposed and unexposed areas in the imaging layer of said imaging member, whereby said exposed areas are rendered more oleophilic than said unexposed areas by heat provided by said imagewise exposing.

20. The method of claim 19 wherein said imaging member further comprises a photothermal conversion material, and imagewise exposing is carried out using an IR radiation emitting laser.

21. The method of claim 19 wherein said imagewise exposing is carried out using a thermal head.

22. The method of claim 19 wherein said heat-sensitive polymer is represented by one of the structures I, II or III:

I

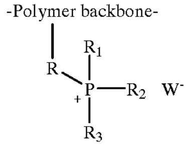

II

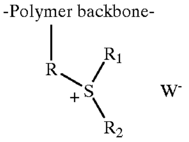

-continued

III

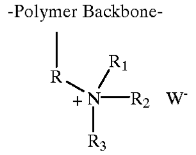

wherein R is an alkylene, arylene or cycloalkylene group or a combination of two or more of such groups, $R_1$, $R_2$ and $R_3$ are independently alkyl, aryl or cycloalkyl groups, or any two of $R_1$, $R_2$ and $R_3$ can be combined to form a heterocyclic ring with the charged nitrogen, phosphorus or sulfur atom, and $W^-$ is an anion, and said imaging member further comprises a photothermal conversion material that is carbon black or an IR radiation absorbing dye.

23. The method of claim 19 wherein said imaging member is provided in step A by spraying of formulation of said heat-sensitive vinyl polymer onto a cylindrical support.

24. A method of printing comprising the steps of:

A) providing the imaging member of claim 1,

B) imagewise exposing said imaging member to energy to provide exposed and unexposed areas in the imaging layer of said imaging member, whereby said exposed areas are rendered more oleophilic than said unexposed areas by heat provided by said imagewise exposing, and C) contacting said imagewise exposed imaging member with a fountain solution and a lithographic printing ink, and imagewise transferring said ink to a receiving material.

25. An imaging member comprising a support having thereon a hydrophilic imaging layer comprising a hydrophilic heat-sensitive crosslinked vinyl polymer represented by either structures I or II:

(I)

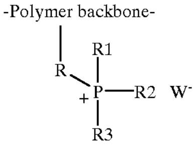

-continued (II)

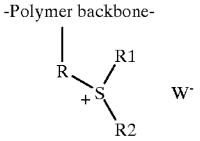

wherein R is an ethyleneoxycarbonyl or phenylenemethylene group, and $R_1$, $R_2$ and $R_3$ are independently a methyl or ethyl group.

26. The imaging member of claim 25, wherein $W^-$ is a halide or carboxylate.

27. An imaging member comprising a support having thereon a hydrophilic imaging layer comprising a hydrophilic heat-sensitive crosslinked vinyl polymer having organoammonium groups which is represented by the structure III:

(III)

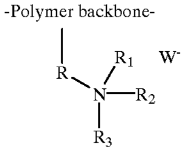

wherein R is an ethyleneoxycarbonyl or phenylenemethylene group, and $R_1$, $R_2$ and $R_3$ are independently a methyl or ethyl group and $W^-$ is a halide or carboxylate.

28. An imaging member comprising a support having thereon a hydrophilic imaging layer comprising a hydrophilic heat-sensitive crosslinked vinyl polymer having organoammonium groups represented by the structure III:

(III)

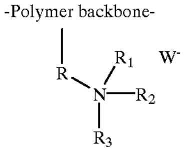

wherein R is an alkylene, arylene, arylene or cycloalkylene group or combination of two or more of such groups, $R_1$, $R_2$ and $R_3$ are independently an alkyl, aryl, cycloalkyl group, or any two of $R_1$, $R_2$ and $R_3$ can be combined to form a heterocyclic ring with the charged nitrogen atom.

* * * * *

UNITED STATES PATENT AND TRADEMARK OFFICE

CERTIFICATE OF CORRECTION

PATENT NO. : 6,190,830 B1
DATED : February 20, 2001
INVENTOR(S) : Leon et al.

It is certified that error appears in the above-identified patent and that said Letters Patent is hereby corrected as shown below:

Title page,
Item [54], Title: "HEAT SENSITIVE" should read -- HEAT-SENSITIVE --

Item [75], Inventor(s): "Rochester;" should read -- Rochester, NY (US); --; "North Jupiter;" should read -- North Jupiter, FL (US); -- and "all of" should be deleted Column 1,
Line 2, "HEAT SENSITIVE" should read -- HEAT-SENSITIVE --

Column 6,
Line 59, "W" should read -- W --

Column 7,
Line 53, "autoxidative" should read -- autooxidative --

Column 9,
IR Dye 5, "$BF4^-$." should read -- $BF_4^-$ --

Column 11,
Line 24, "Fujisu" should read -- Fujitsu --
Line 62, "$cm^2$" should read -- $cm^3$ --
Lines 63 and 67, "eluent." should read -- eluant. --

Column 12,
Line 8, "$cm^2$" should read -- $cm^3$ --
Lines 9, 13, and 14, "eluent." should read -- eluant. --
Line 61, "DOWE®" should read -- DOWEX® --
Line 62, "eluent." should read -- eluant. --

Column 14,
Line 13, "eluent)." should read -- eluant). --

Column 20,
Line 57, "switchable the" should read -- switchable, the --
Line 58, "groups wherein" should read -- groups, wherein --

UNITED STATES PATENT AND TRADEMARK OFFICE

CERTIFICATE OF CORRECTION

PATENT NO. : 6,190,830 B1
DATED : February 20, 2001
INVENTOR(S) : Leon et al.

It is certified that error appears in the above-identified patent and that said Letters Patent is hereby corrected as shown below:

Column 22,
Line 8, "%,y" should read -- %, y --
Line 12, "heat" should read -- heat- --
Line 16, "hydrocholoride)," should read -- hydrochloride), --
Line 17, "(methvl" should read -- (methyl --
Line 20, "methacrylamide)." should read -- methacrylamide), --
Line 20, "methalcrylate-" should read -- methacrylate- --
Line 24, "hvdrochloride)," should read -- hydrochloride), --
Line 31, "(vinylbenzyldimethvlsulfonium" should read -- (vinylbenzyldimethylsulfonium --
Line 44, "arylene" (second occurrence) should be deleted Signed and Sealed this Twelfth Day of March, 2002

*Attest:*

JAMES E. ROGAN

*Attesting Officer* — *Director of the United States Patent and Trademark Office*